(12) United States Patent
Kim

(10) Patent No.: US 11,392,842 B2
(45) Date of Patent: Jul. 19, 2022

(54) INTEGRATED-SYSTEM SIMULATION SYSTEM OBTAINED FROM SIMULATION SYSTEM HAVING C3 SYSTEM OF SYSTEMS

(71) Applicants: Korea Advanced Institute of Science and Technology, Daejeon (KR); eINS S&C Co., Ltd., Jeju-si (KR)

(72) Inventor: Tag Gon Kim, Daejeon (KR)

(73) Assignees: Korea Advanced Institute of Science and Technology, Daejeon (KR); EINS S&C CO., LTD., Jeju-si (KR)

( * ) Notice: Subject to any disclaimer, the term of this patent is extended or adjusted under 35 U.S.C. 154(b) by 1085 days.

(21) Appl. No.: 15/993,869

(22) Filed: May 31, 2018

(65) Prior Publication Data

US 2019/0325326 A1    Oct. 24, 2019

(30) Foreign Application Priority Data

Apr. 23, 2018    (KR) .................... 10-2018-0046688

(51) Int. Cl.
| | | |
|---|---|---|
| *G06F 17/10* | (2006.01) | |
| *G06N 5/04* | (2006.01) | |
| *G06N 3/08* | (2006.01) | |
| *G06N 20/00* | (2019.01) | |
| *G06F 30/20* | (2020.01) | |
| *H04L 41/14* | (2022.01) | |
| *H04W 4/029* | (2018.01) | |

(52) U.S. Cl.
CPC .............. *G06N 5/04* (2013.01); *G06F 30/20* (2020.01); *G06N 3/08* (2013.01); *G06N 20/00* (2019.01); *H04L 41/145* (2013.01); *H04W 4/029* (2018.02)

(58) Field of Classification Search
CPC ............ G06F 17/5009; G06F 17/5022; G06F 17/5036
USPC ........................... 703/13, 17, 21, 22
See application file for complete search history.

(56) References Cited

U.S. PATENT DOCUMENTS

| | | | | |
|---|---|---|---|---|
| 7,844,432 B1* | 11/2010 | Jones | ................... | H04L 47/127 703/13 |
| 9,247,430 B2* | 1/2016 | Kountouris | ........... | H04W 12/06 |
| 9,635,050 B2* | 4/2017 | Di Pietro | ................ | H04L 63/02 |

* cited by examiner

*Primary Examiner* — Andy Ho
(74) *Attorney, Agent, or Firm* — Rabin & Berdo, P.C.

(57) ABSTRACT

Provided is an integrated-system simulation system obtained from a simulation system having a command, control, and communication (C3) system of systems (SoS). The integrated-system simulation system includes an abstracted command and control (C2) model including a traffic model including inter-node traffic information transferred according to time, a mobility model including position information of nodes, and an interface model making the traffic model and the mobility model interoperate, and a communication (C) model configured to be combined with the abstracted C2 model so as to interact with the abstracted C2 model in a full-duplex manner. The abstracted C2 model is generated by acquiring traffic and mobility data between the C2 model and the C model of the SoS simulation system, hypothesizing a form of the abstracted C2 model, and learning the traffic and mobility data acquired from the SoS simulation system and determining variables of the abstracted C2 model form.

10 Claims, 11 Drawing Sheets

INTEGRATED-SYSTEM SIMULATION SYSTEM OBTAINED FROM SIMULATION SYSTEM HAVING C3 SYSTEM OF SYSTEMS

CROSS-REFERENCE TO RELATED APPLICATION

This application claims priority to and the benefit of Korean Patent Application No. 10-2018-0046688 filed on Apr. 23, 2018, the disclosure of which is incorporated herein by reference in its entirety.

BACKGROUND

1. Field of the Invention

The present invention relates to an integrated-system simulation system obtained from a simulation system having a command, control, and communication (C3) system of systems (SoS), and more particularly, to an integrated-system simulation system generated by abstraction.

2. Discussion of Related Art

In a modern battlefield, a communication (C) system performs an important role in sharing battlefield situations and transferring information among command and control (C2) systems which are geographically distributed. To analyze such communication in detail, in national defense modeling and simulation, C system analysis is carried out through a C3 SoS composed of C2 and C systems.

So far, research has been conducted to analyze communication performance of a C system with respect to various battlefield scenarios in the national defense simulation field. Specifically, a battlefield scenario is statistically hypothesized in advance to construct a simplex model for traffic and mobility, and is combined with a whole C simulator to conduct the research.

In recent research, to reflect realistic traffic and mobility, a C2 simulator in which a battlefield scenario is implemented interoperates with a C simulator and thereby constitutes a C3 SoS such that C system analysis is carried out.

FIG. 1 schematically shows a structure for analyzing an SoS C system. SoS-based C system analysis shown in FIG. 1 has a time constraint that a long execution time is required for simulation of interoperation between a C simulator and a C2 simulator and a spatial constraint that C simulator analysis is allowed only when a C2 simulator exists.

To overcome these constraints, it is necessary to analyze an integrated system, and a simplex model is constructed in existing research. In this case, however, a traffic and mobility model is constructed without considering an input received from an external system, such as a C simulator, and thus has an output only. Therefore, when the simplex traffic and mobility model instead of a C2 simulator is applied to a C3 SoS, it is not possible to analyze how C2 simulation is affected by simulation results of the C simulator. In other words, it is impossible to apply changes in traffic and mobility resulting from C simulation to entire simulation.

SUMMARY OF THE INVENTION

The present invention is directed to providing a communication analysis method in an integrated system environment in which a command and control (C2) model constructed in a full-duplex manner by abstracting traffic and mobility of a C2 system is combined with a communication (C) system.

According to an aspect of the present invention, there is provided an integrated-system simulation system obtained from a simulation system having a command, control, and communication (C3) system of systems (SoS), the integrated-system simulation system including: an abstracted C2 model including a traffic model including inter-node traffic information transferred according to time, a mobility model including position information of nodes, and an interface model configured to make the traffic model and the mobility model interoperate; and a C model configured to be combined with the abstracted C2 model so as to interact with the abstracted C2 model in a full-duplex manner. The abstracted C2 model is generated by acquiring traffic and mobility data between the C2 model and the C model of the SoS simulation system, hypothesizing a form of an abstracted C2 model, and learning the traffic and mobility data acquired from the SoS simulation system and determining variables of the abstracted C2 model form.

The traffic model may include variables of a time interval IDT between packets, whether there is a connection C between the nodes, an initial time TST at which packet generation is started, and a time TET at which packet generation is finished.

The traffic model may perform a process including: generating traffic at time intervals of $T_{IDT}$ for a time of $T_{START}$ in an initial state; receiving communication effects from the interface model; learning the generated traffic and the communication effects received from the interface model with a machine learning-based neural network and determining the variables of the time interval IDT between packets, whether there is the connection C between the nodes, the initial time TST at which packet generation is started, and the time TET at which packet generation is finished; and when there is the connection C between the nodes, generating traffic at the intervals IDT after a time difference between TST and $T_{START}$ elapses, and stopping traffic generation at the time TET, and when there is not the connection C between the nodes, generating no traffic.

The mobility model may include variables of a probability $P_{MOVE}$ of a node shifting to a moving state MOVE, a time $D_{MOVE}$ for which the node stays in the moving state MOVE, a time $D_{STOP}$ for which the node stays in a stop state STOP, and a moving speed SPD and an angle ANG of the node moving in the moving state MOVE.

The mobility model may perform a process including: calculating initial position information of the node; receiving communication effects from the interface model; determining the variables of $P_{MOVE}$, $D_{MOVE}$, $D_{STOP}$, SPD, and ANG on the basis of the initial position information of the node and the communication effects received from the interface model by using a machine learning-based neural network; and updating the position information of the node through SPD and ANG for the time $D_{MOVE}$ when the node is in the moving state MOVE, and not updating the position information of the node for the time $D_{STOP}$ when the node is in the stop state STOP.

The interface model may calculate communication effects accumulated through events received from the C model and transfer the calculated communication effects to the traffic model and the mobility model.

Additionally, the interface model may receive traffic information and position information generated by the traffic model and the mobility model and transfer the received traffic information and position information to the C model.

The communication effects may be a packet delivery ratio (PDR) indicating a probability of arrival of an inter-node packet and an end-to-end delay indicating a delay time taken for a packet to arrive.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
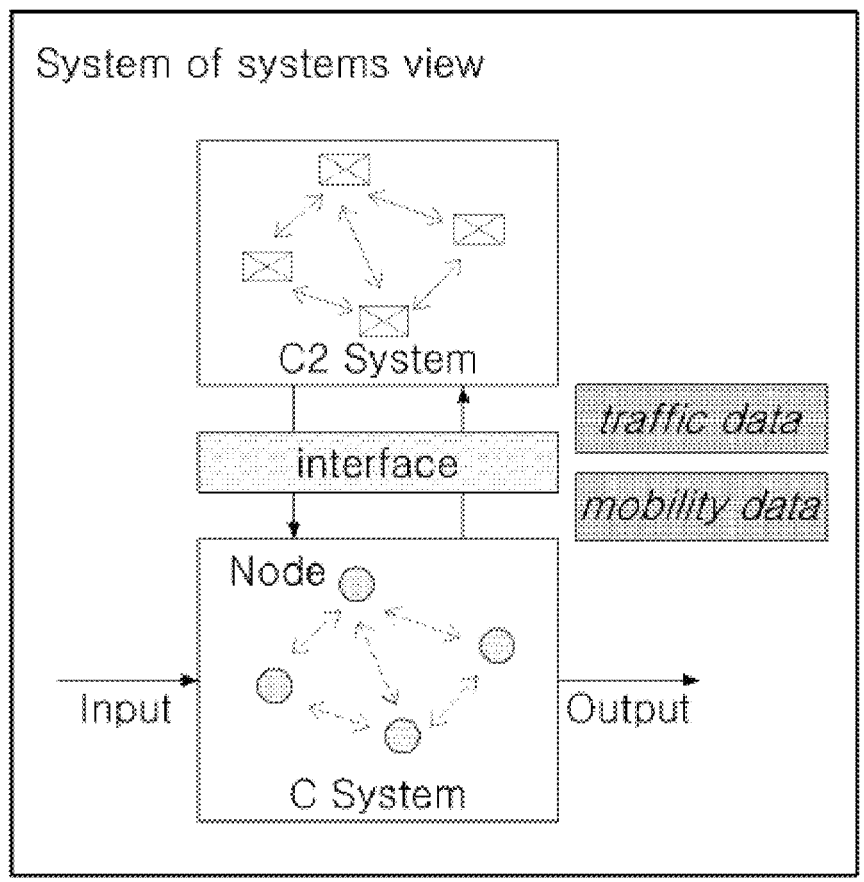
FIG. 1 schematically shows a structure for analyzing a system of systems (SoS) communication (C) system.

Since the present invention may be modified in various ways and may have various forms, specific embodiments are illustrated in the drawings and described in detail.

The following detailed description is provided to help comprehensive understanding of a method, an apparatus, and/or a system disclosed herein. However, this is merely exemplary, and the present invention is not limited thereto.

While describing the present invention, when it is determined that a detailed description of a known art related to the present invention may unnecessarily obscure the gist of the present invention, the detailed description will be omitted. Terms which will be used below are defined in consideration of functionality in the present invention, which may vary according to an intention of a user or an operator or a usual practice. Therefore, definitions thereof should be made on the basis of the overall contents of this specification. Terminology used herein is for the purpose of describing exemplary embodiments of the present invention only and is not intended to be limiting. The singular forms are intended to include the plural forms as well, unless the context clearly indicates otherwise. It should be understood that the terms "comprises," "comprising," "includes," and "including," when used herein, specify the presence of stated features, numerals, steps, operations, elements, or some or combinations thereof, but do not preclude the presence or addition of one or more other features, numerals, steps, operations, elements, or some or combinations thereof.

The terms "first," "second," etc. may be used to describe various components. However, the components are not limited by the terms, and the terms are used only to distinguish one component from other components. Hereinafter, an integrated-system simulation system according to an exemplary embodiment of the present invention will be described in detail with reference to the accompanying drawings.

Figure 2:
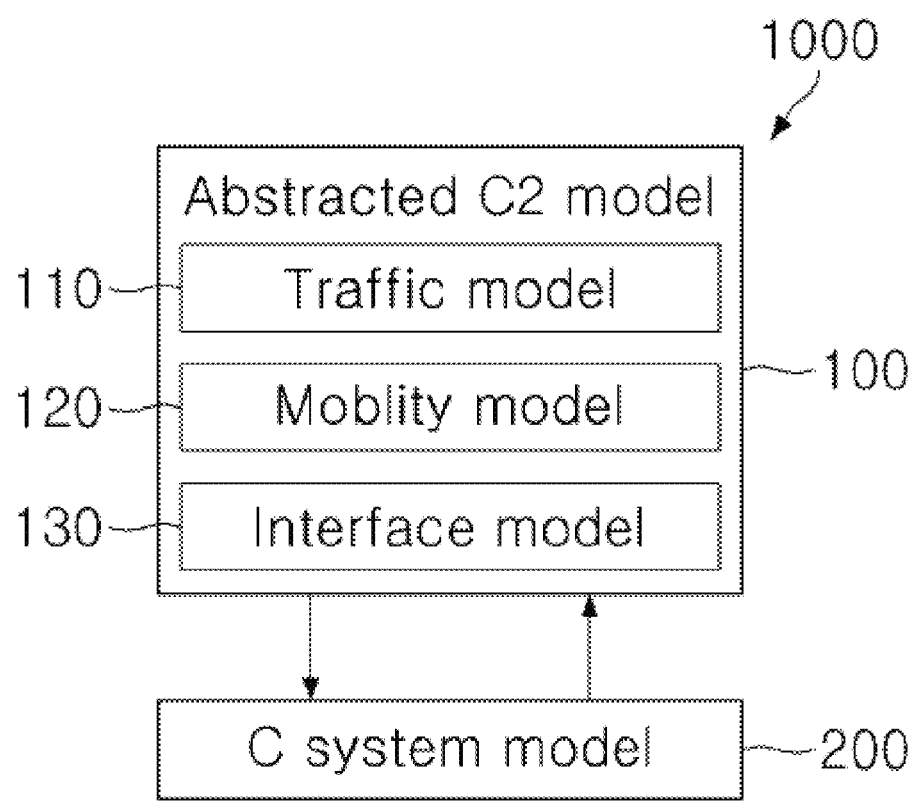
FIG. 2 schematically shows an integrated-system simulation system according to an exemplary embodiment of the present invention.

FIG. 2 schematically shows an integrated-system simulation system 1000 according to an exemplary embodiment of the present invention.

The integrated-system simulation system 1000 according to an exemplary embodiment of the present invention includes an abstracted command and control (C2) model 100 and a communication (C) model 200.

The abstracted C2 model 100 includes a traffic model 110, a mobility model 120, and an interface model 130.

According to an exemplary embodiment of the present invention, in an abstraction process of a C2 simulator, the traffic model 110 and the mobility model 120 are constructed in consideration of full-duplex interaction with a C simulator so that a C system may be readily analyzed.

To this end, the traffic model 110 and the mobility model 120 are defined in a full-duplex manner, and a machine learning technique is used to learn variables of the models from data obtained through existing command, control, and communication (C3) system of systems (SoS) simulation. Subsequently, an abstracted C2 simulator is completed such that an integrated-system simulation system is constructed.

Figure 3:
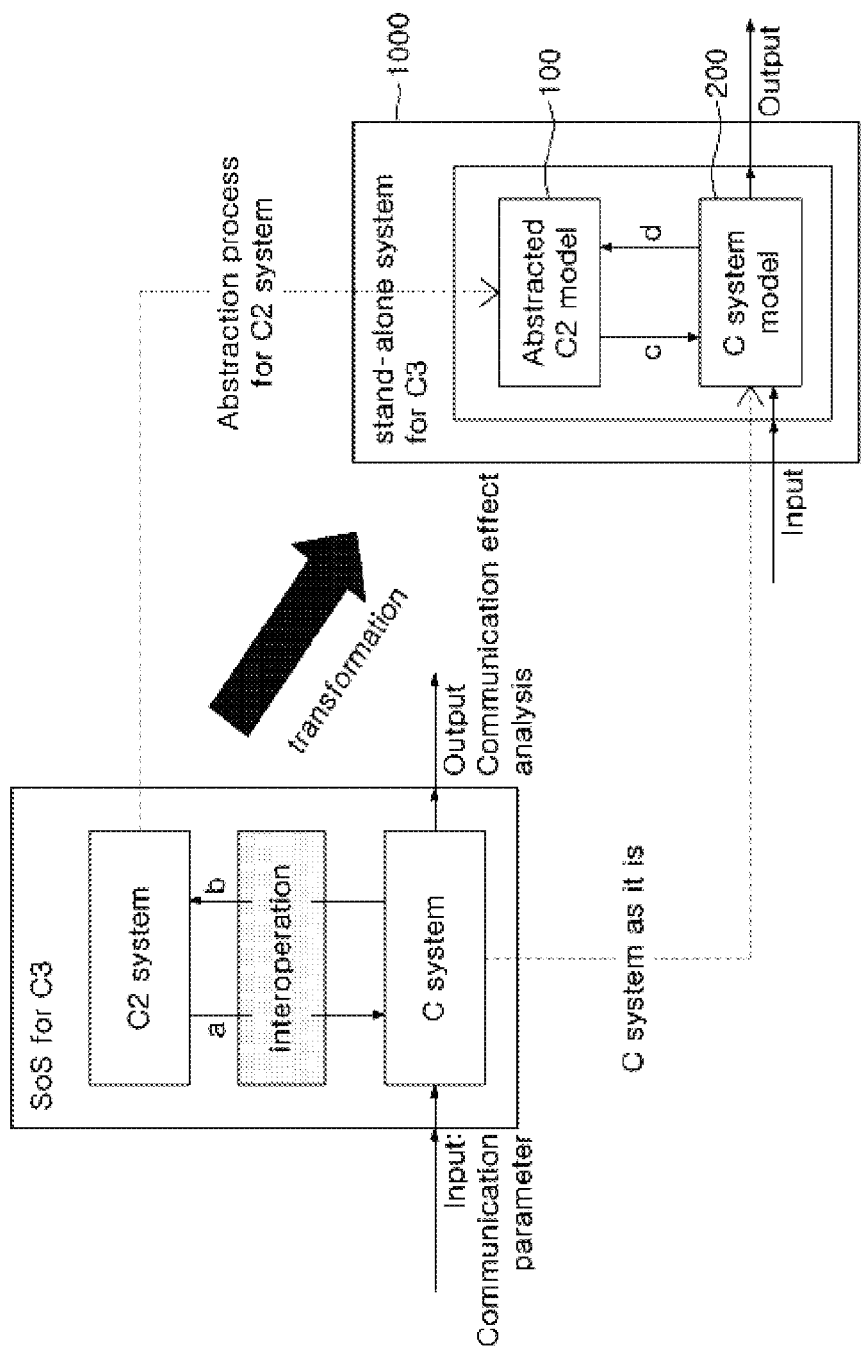
FIG. 3 schematically shows a transformation process from a command, control, and communication (C3) SoS simulation system to the integrated-system simulation system according to an exemplary embodiment of the present invention.

FIG. 3 schematically shows a transformation process from a C3 SoS simulation system to the integrated-system simulation system 1000 according to an exemplary embodiment of the present invention.

The integrated-system simulation system 1000 according to an exemplary embodiment of the present invention may be implemented through an abstraction process of an SoS simulation system.

According to an exemplary embodiment of the present invention, an abstraction process is performed on a situation in which a C system in a C3 SoS is analyzed as shown in FIG. 3.

In the C3 SoS shown on the left side of FIG. 3, an output (an input of a C system in a direction a) of a C2 system is affected by an input (an output of the C system in a direction b) of the C2 system.

To reflect this characteristic as it is, the C2 system is abstracted so that an output (in a direction c) of the abstracted C2 model 100 shown on the right side of FIG. 3 is affected by an input (in a direction d) of the C2 system. In this process, the C system which is an analysis target is used as it is without abstraction, and only the C2 system is abstracted, such that the entire C3 SoS is transformed into an integrated system.

The abstraction process allows a reduction in simulation execution time and allows analysis even when there is no C2 system. The abstraction process will be described in detail below with reference to FIG. 4.

Figure 4:
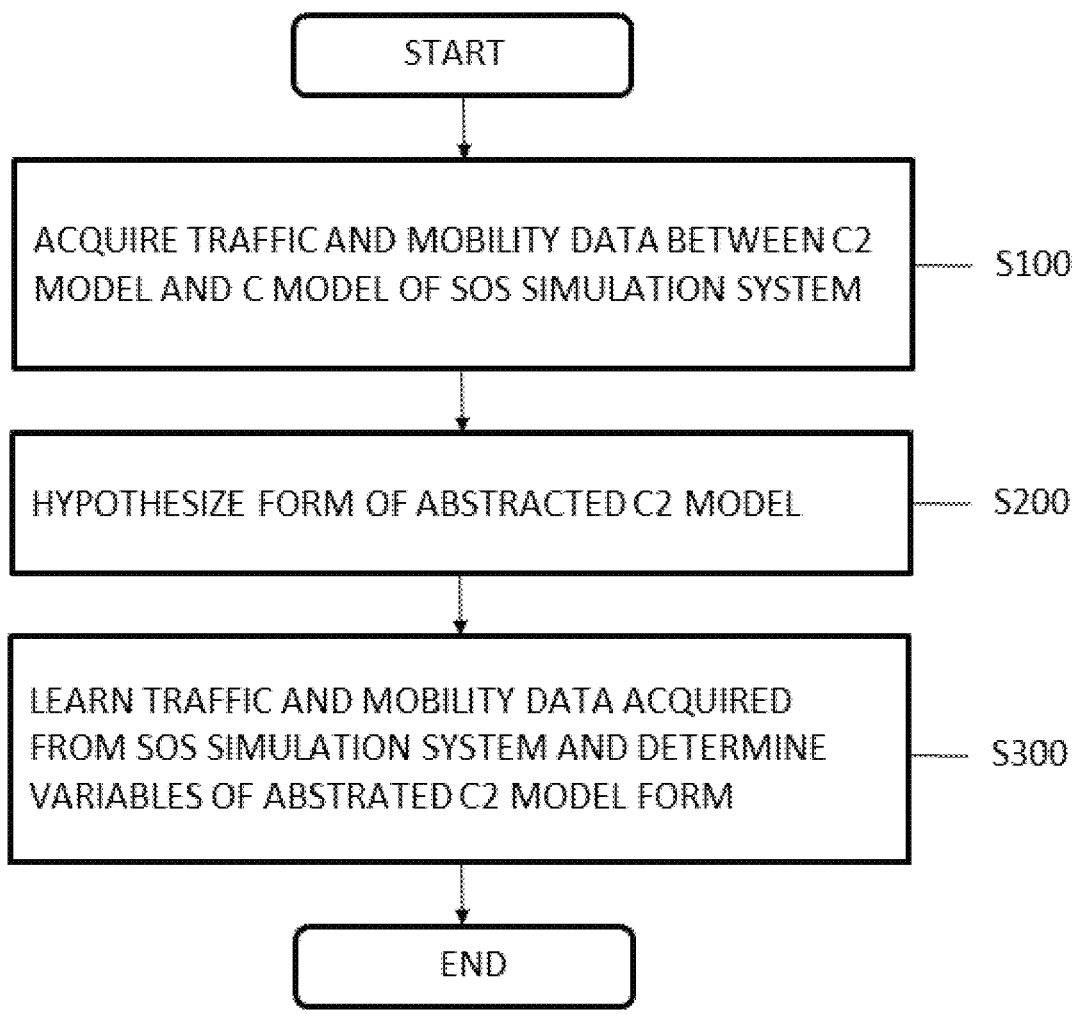
FIG. 4 is a flowchart illustrating an abstraction process of an abstracted command and control (C2) model according to an exemplary embodiment of the present invention.
Figure 5:
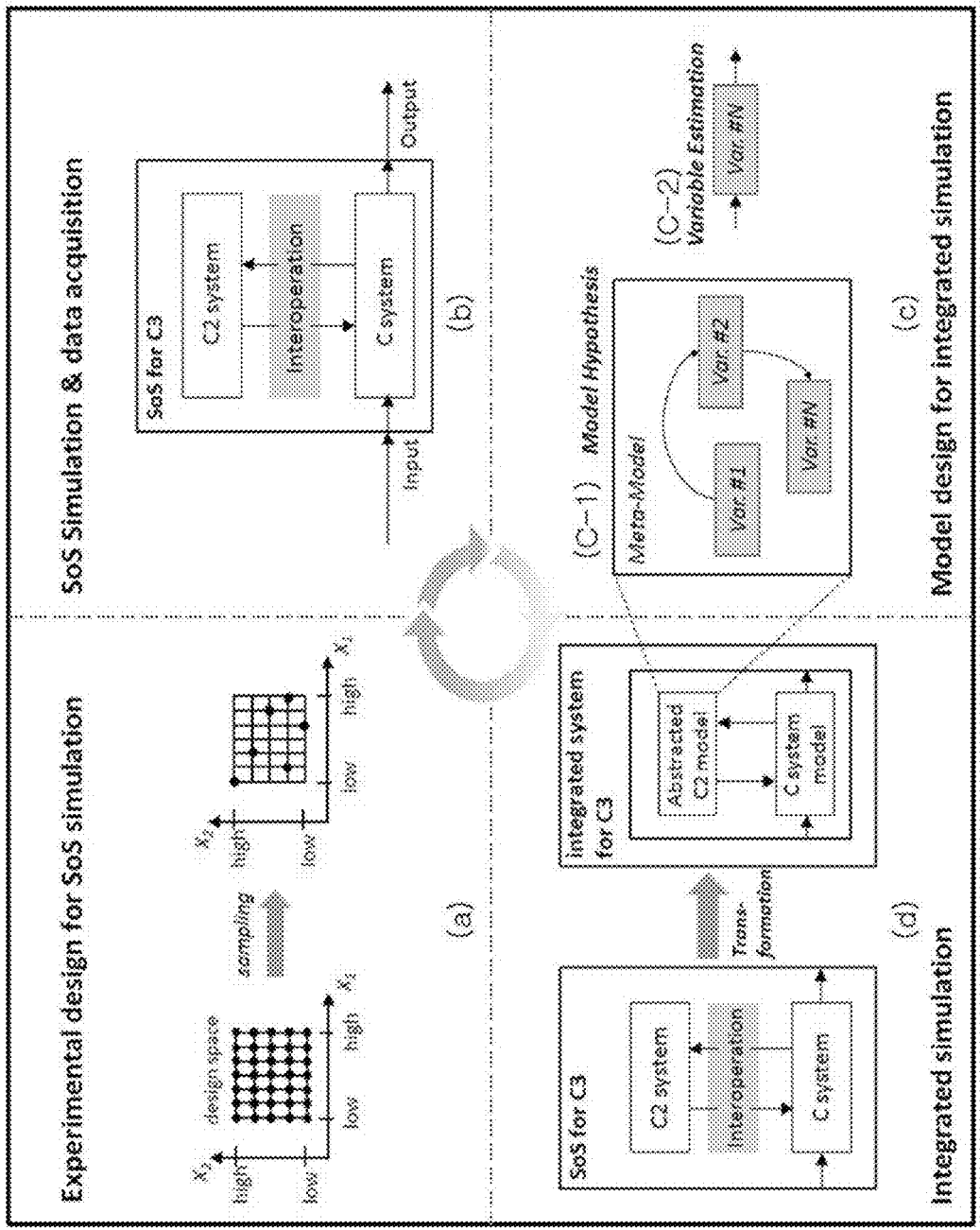
FIG. 5 schematically shows the abstraction process of FIG. 4.

FIG. 4 is a flowchart illustrating an abstraction process of the abstracted C2 model 100 according to an exemplary embodiment of the present invention, and FIG. 5 schematically shows the abstraction process of FIG. 4.

The abstraction process of the C2 model 100 in the C3 SoS includes an operation of acquiring traffic and mobility data between the C2 model and the C model of the SoS simulation system (S100), an operation of hypothesizing a form of an abstracted C2 model (S200), and an operation of learning the traffic and mobility data acquired from the SoS simulation system and determining variables of the abstracted C2 model form (S300).

In operation S100, traffic and mobility data between the C2 model and the C model of the SoS simulation system is acquired. Abstraction requires data from the SoS, and to this end, an experimental design method for extracting experimental points may be performed before SoS simulation (see (a) of FIG. 5). Subsequently, a C3 SoS simulation process is performed with respect to the experimental points, and traffic and mobility data exchanged between the C system and the C2 system is acquired in this process (see (b) of FIG. 5).

In operation S200, the form of an abstracted C2 model is hypothesized. After data is acquired through operation S100, the form of the C2 model is hypothesized first (see (c-1) in (c) of FIG. 5).

In operation S300, the traffic and mobility data acquired from the SoS simulation system is learned, and variables of the abstracted C2 model form are determined.

Metamodeling is performed on the variables of the model on the basis of the data obtained from the SoS (see (c-2) in (c) of FIG. 5). After an abstracted C2 model is constructed, the abstracted C2 model is combined with the existing C system to constitute an integrated system (see (d) of FIG. 5).

Figure 6:
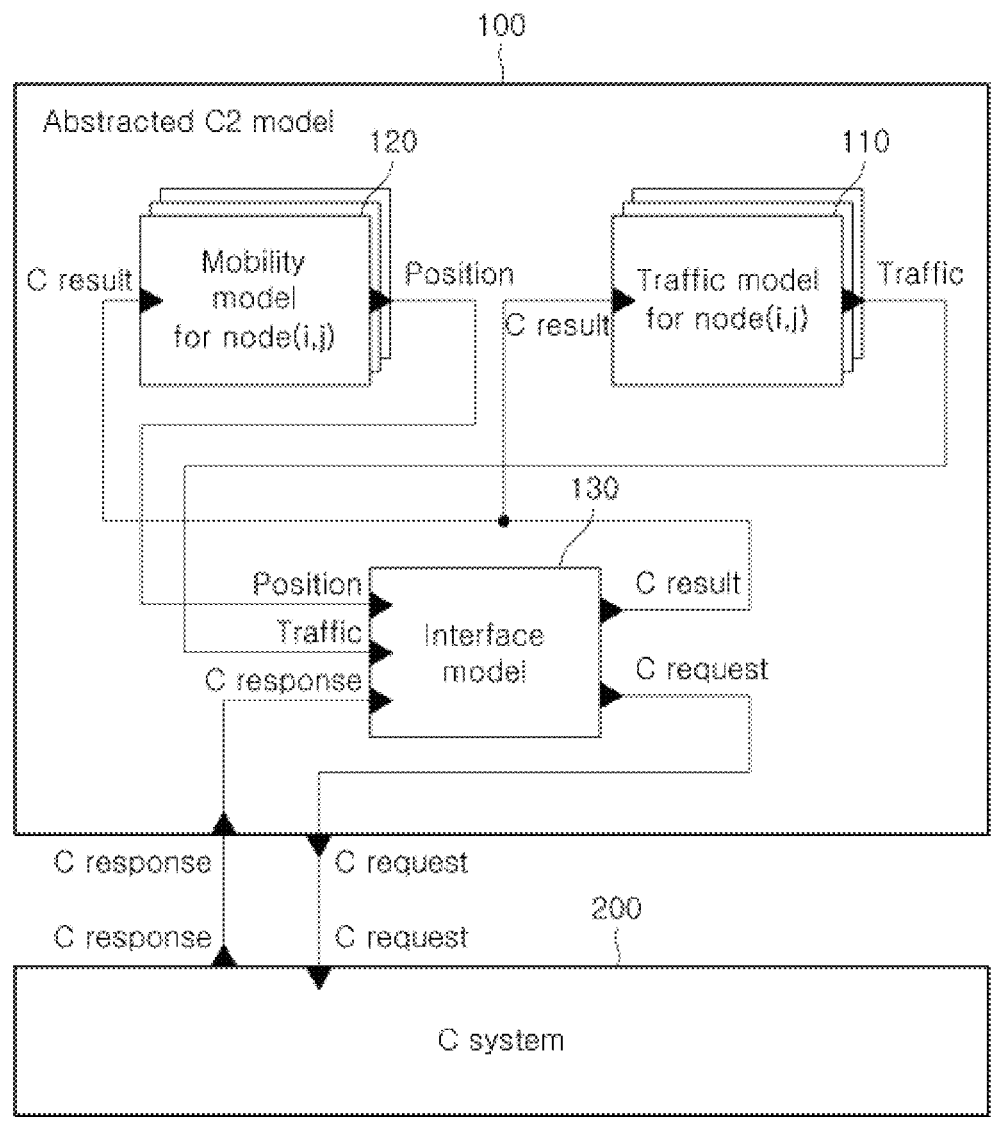
FIG. 6 shows a structure of the abstracted C2 model and combination of the abstracted C2 model and a C model according to an exemplary embodiment of the present invention.

FIG. 6 shows a structure of the abstracted C2 model 100 and combination of the abstracted C2 model 100 and the C model 200 according to an exemplary embodiment of the present invention.

In a C3 SoS, a C2 system is composed of various battlefield elements, such as maneuver, detection, engagement, and the like. However, for C system analysis, only elements required for the analysis are extracted from the elements and constitute an abstracted C2 model.

Meanwhile, C system analysis generally requires traffic information, mobility information, and network information (connection information among nodes), whereas in an exemplary embodiment of the present invention, the required information is abstracted into a traffic model and a mobility model to handle a case in which network information is determined by traffic and mobility information. In a process of connecting the traffic and mobility models and a C model, an interface model for directly replacing an existing C2 system without modifying an input or output is constructed.

As shown in FIG. 6, the abstracted C2 model according to an exemplary embodiment of the present invention includes the traffic model 110, the mobility model 120, and the interface model 130.

The traffic model 110 serves to generate data from a source node to a destination node, and one traffic model 110 is required for each pair of a source node and a destination node.

The mobility model 120 serves to generate position information of a corresponding node, and each node requires one mobility model 120.

The interface model 130 serves to manage the traffic model 110 and the mobility model 120 overall by making the traffic model 110 and the mobility model 120 interoperate.

The traffic model 110 is affected by the C model 200, and the interface model 130 serves to connect a packet delivery ratio (PDR) and an end-to-end delay of communication, which are affected by the C model 200, to inputs of the traffic model 110 and the mobility model 120. Here, the PDR refers to a probability of arrival of an inter-node packet, and the end-to-end delay refers to a delay time taken for a packet to arrive.

Such a role of the interface model 130 will be described with reference to FIG. 5. Since the C model 200 is a system (master-slave) structure which generates an output only when a message is requested by the abstracted C2 model 100, it is necessary for the abstracted C2 model 100 to request traffic from the C model 200 for a certain initial time.

The interface model 130 according to an exemplary embodiment of the present invention transfers traffic generated by the traffic model 110 to the C model 200 via a C request port for the certain initial time of simulation. Subsequently, the interface model 130 receives communication effects of every event from the C model 200 via a C response port, accumulates the communication effects, and transfers average communication effects brought about for a certain time to the traffic model 110 and the mobility model 120 via a C result port.

The traffic model 110 and the mobility model 120 receiving the communication effects may calculate variable values therein by using the communication effects as inputs and complete a simulation model on the basis of the calculated variable values.

Detailed structures of the traffic model 110, the mobility model 120, and the interface model 130 constituting the abstracted C2 model 100 according to an exemplary embodiment of the present invention will be separately described below with reference to FIGS. 7 to 9.

Figure 7:
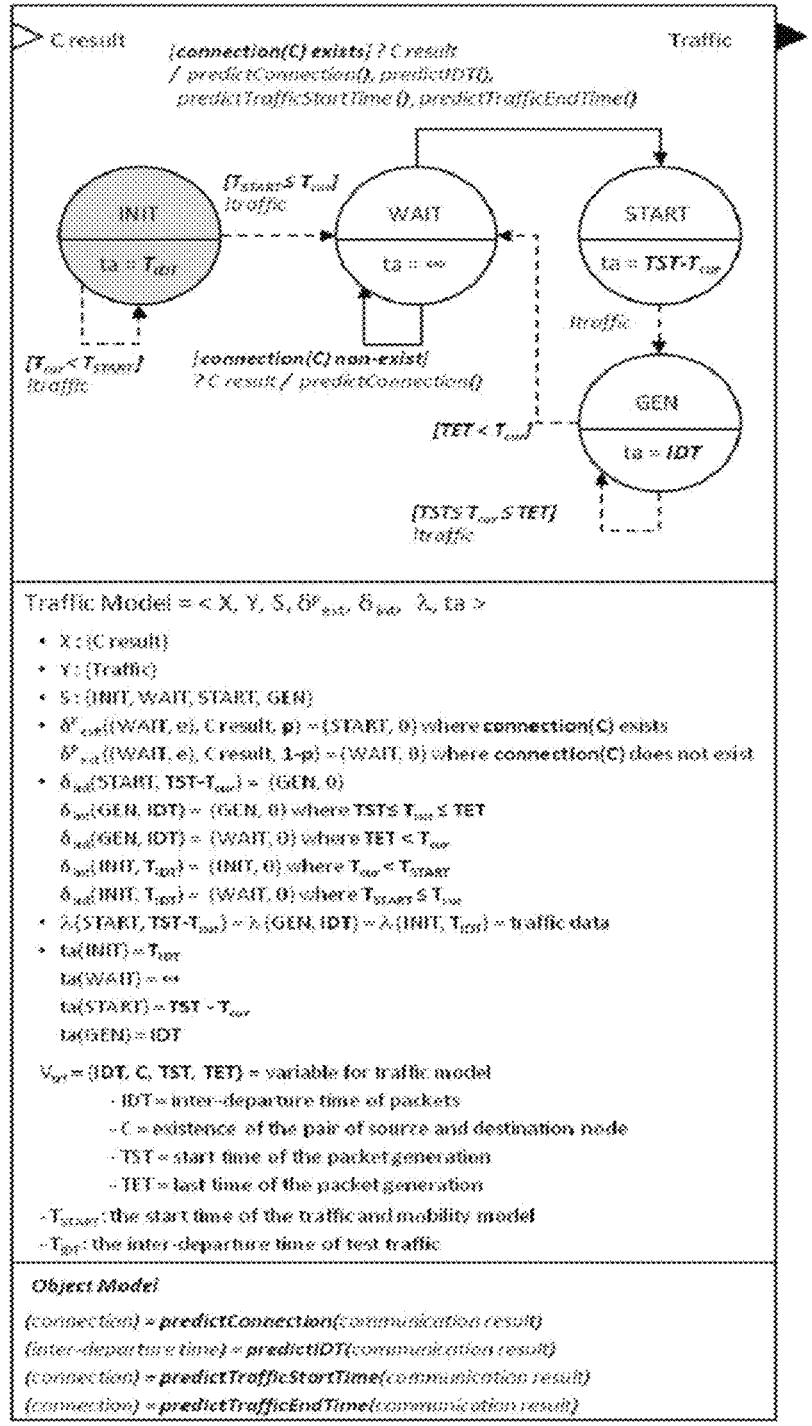
FIG. 7 shows a detailed structure of a traffic model according to an exemplary embodiment of the present invention.

FIG. 7 shows a detailed structure of the traffic model 110 according to an exemplary embodiment of the present invention.

The traffic model 110 according to an exemplary embodiment of the present invention includes variables of a time interval IDT between packets, whether there is a connection C between nodes, an initial time TST at which packet generation is started, and a time TET at which packet generation is finished.

The traffic model 110 generates a packet at the time intervals IDT between the times TST and TET when there is C, and is a probabilistic discrete-event model which probabilistically varies depending on whether there is C.

Referring to FIG. 7, the traffic model 110 according to an exemplary embodiment of the present invention has a total of four states INIT, WAIT, START, and GEN.

The traffic model 110 generates traffic at time intervals of $T_{IDT}$ for a time of $T_{START}$ in the INIT state and then waits in the WAIT state.

Subsequently, the traffic model 110 receives communication effects, such as a PDR, an end-to-end delay, etc., from the interface model 130, learns the generated traffic and the communication effects received from the interface model 130 with a machine learning-based neural network, and then calculates variable values of the time interval IDT between packets, whether there is the connection C between the nodes, the initial time TST at which packet generation is started, and the time TET at which packet generation is finished through predictIDT( ), predictConnection( ), predictTraficStartTime( ), and predictTrafficEnd( ) constituting the machine learning-based neural network.

When there is the connection C between the nodes, the traffic model 110 switches to the START state to generate traffic. After a time difference between TST and $T_{START}$ (TST−$T_{START}$) elapses, the traffic model 110 switches to the GEN state and generates traffic at the intervals IDT. At the time TET, the traffic model 110 stops traffic generation and switches to the WAIT state. On the other hand, when there is not the connection C between the nodes, the traffic model 110 generates no traffic. Here, $T_{START}$ is a start time of the traffic model 110, and $T_{IDT}$ is a time interval between pieces of traffic.

The above-described traffic model 110 may generate different forms of traffic according to communication effects calculated by the C model 200.

Figure 8:
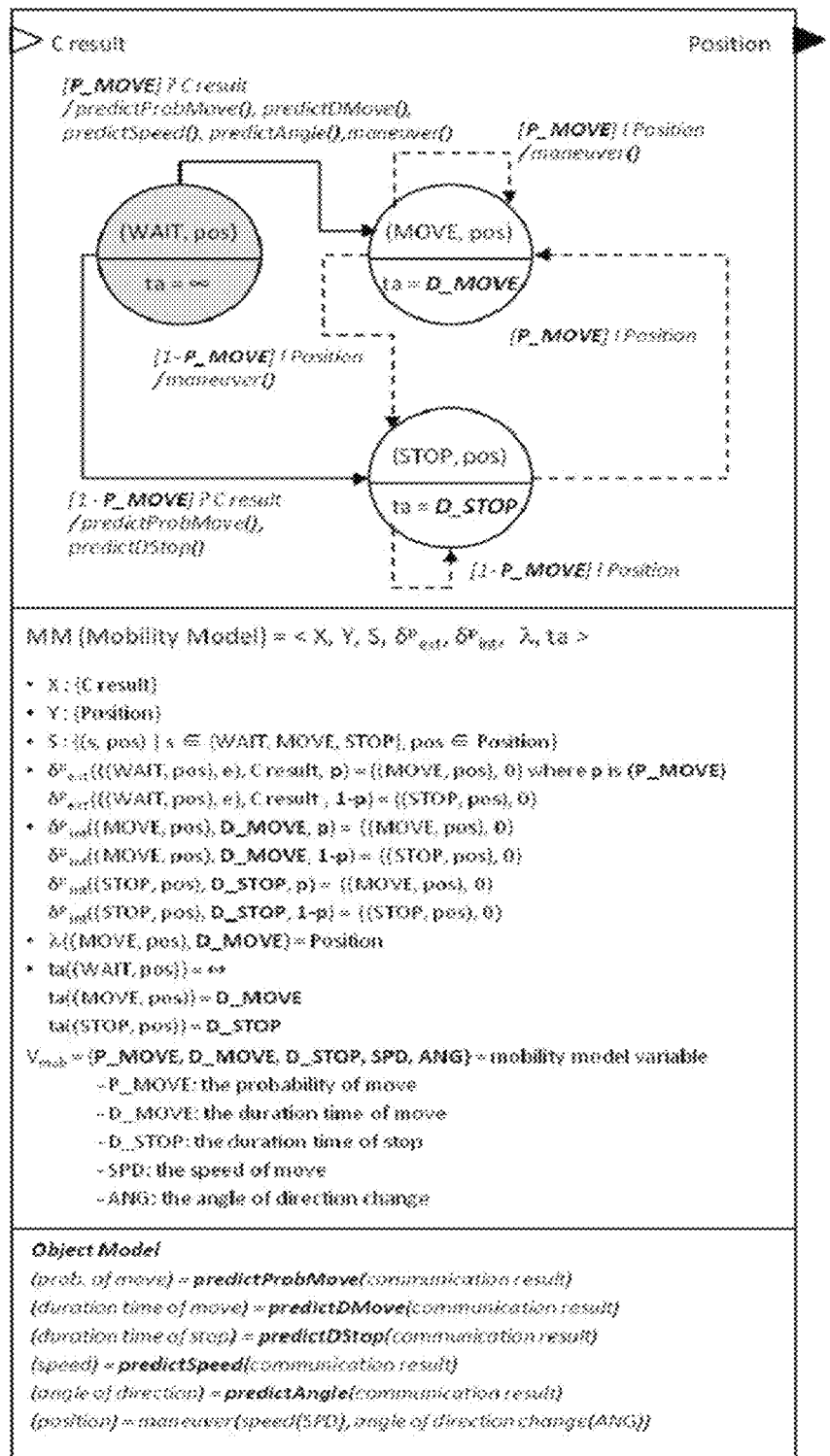
FIG. 8 shows a detailed structure of a mobility model according to an exemplary embodiment of the present invention.

FIG. 8 shows a detailed structure of the mobility model 120 according to an exemplary embodiment of the present invention.

Referring to FIG. 8, the mobility model 120 according to an exemplary embodiment of the present invention includes variables of a probability $P_{MOVE}$ of a node shifting to a moving state MOVE, a time $D_{MOVE}$ for which the node stays in the moving state MOVE, a time $D_{STOP}$ for which the node stays in a stop state STOP, and a moving speed SPD and an angle ANG of the node moving in the moving state MOVE.

A probability of the mobility model 120 staying in a (MOVE, pos) state is determined to be P_MOVE, and the mobility model 120 generates position information through SPD and ANG for a time of D_MOVE in the corresponding state or stays in a (STOP, pos) state for a time of D_STOP. The mobility model 120 according to an exemplary embodiment of the present invention is also a probabilistic discrete-event model which probabilistically varies according to the value of D_MOVE.

The mobility model 120 has a total of three states (WAIT, pos), (MOVE, pos), and (STOP, pos).

At first, in the (WAIT, pos) state, the mobility model 120 calculates initial position information of a node and waits. Like the traffic model 110, after receiving communication effects from the interface model 130, the mobility model 120 calculates variable values of $P_{MOVE}$, $D_{MOVE}$, $D_{STOP}$, SPD, and ANG through predictProbMove( ), predictDMove( ), predictDStop( ), predictSpeed( ), and predictAngle( ) constituting a machine learning-based neural network on the basis of the initial position information of the node and the communication effects received from the interface model 130.

The mobility model 120 updates the position information of the node through SPD and ANG for the time $D_{MOVE}$ in the moving state (MOVE, pos) of the node, and does not update the position information for the time $D_{STOP}$ in the stop state (STOP, pos).

The mobility model 120 stays in the (MOVE, pos) state with a probability value of P_MOVE every time each state ends. The five variable values are affected by the C model 200 via the neural network, and thus the above-described mobility model 120 may generate other mobility information.

Figure 9:
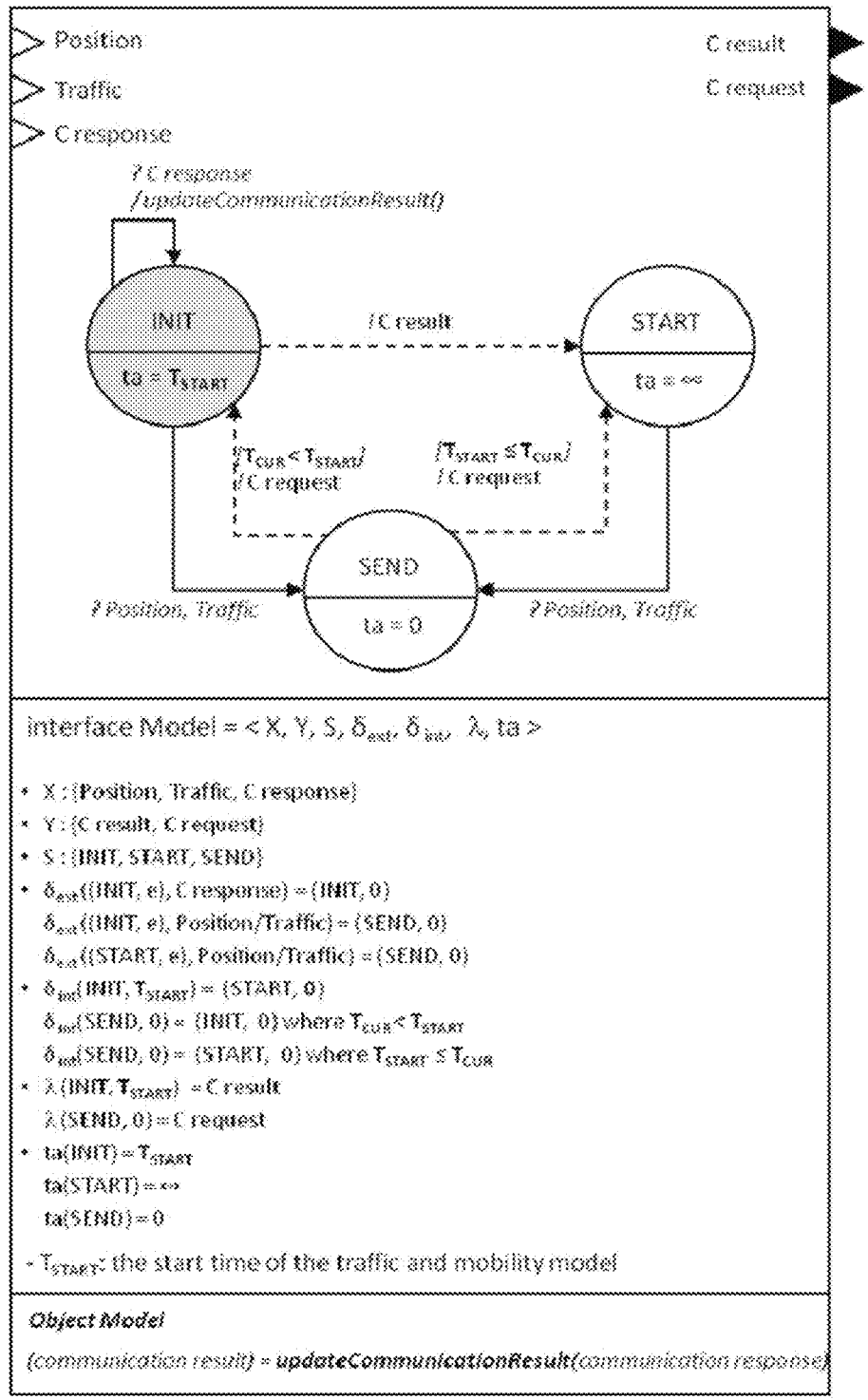
FIG. 9 shows a detailed structure of an interface model according to an exemplary embodiment of the present invention.

FIG. 9 shows a detailed structure of the interface model 130 according to an exemplary embodiment of the present invention.

The interface model 130 according to an exemplary embodiment of the present invention calculates communication effects accumulated through events received from the C model 200 for the initial time of $T_{START}$ and transfers the calculated results (communication effects) to the traffic model 110 and the mobility model 120 via the C result port.

Subsequently, the interface model 130 receives traffic information and position information generated by the traffic model 110 and the mobility model 120 via the C request port and transfers the received traffic information and position information to the C model 200.

The interface model 130 according to an exemplary embodiment of the present invention has a total of three states INIT, START, and SEND.

After the time of $T_{START}$ elapses in the INIT state, the interface model 130 calculates a PDR and an end-to-end delay, which are average communication effects, through updateCommunicationResult( ), updates existing PDR and end-to-end delay, and transmits the updated PDR and end-to-end delay to the traffic model 110 and the mobility model 120.

The traffic model 110 and the mobility model 120 receiving the PDR and the end-to-end delay determine variables, thereby determining variable values according to the communication effects. In this process, the interface model 130 serves to assist generation of the traffic model 110 and the mobility model 120 which vary according to status of the C model 200, that is, communication effects.

Figure 10:
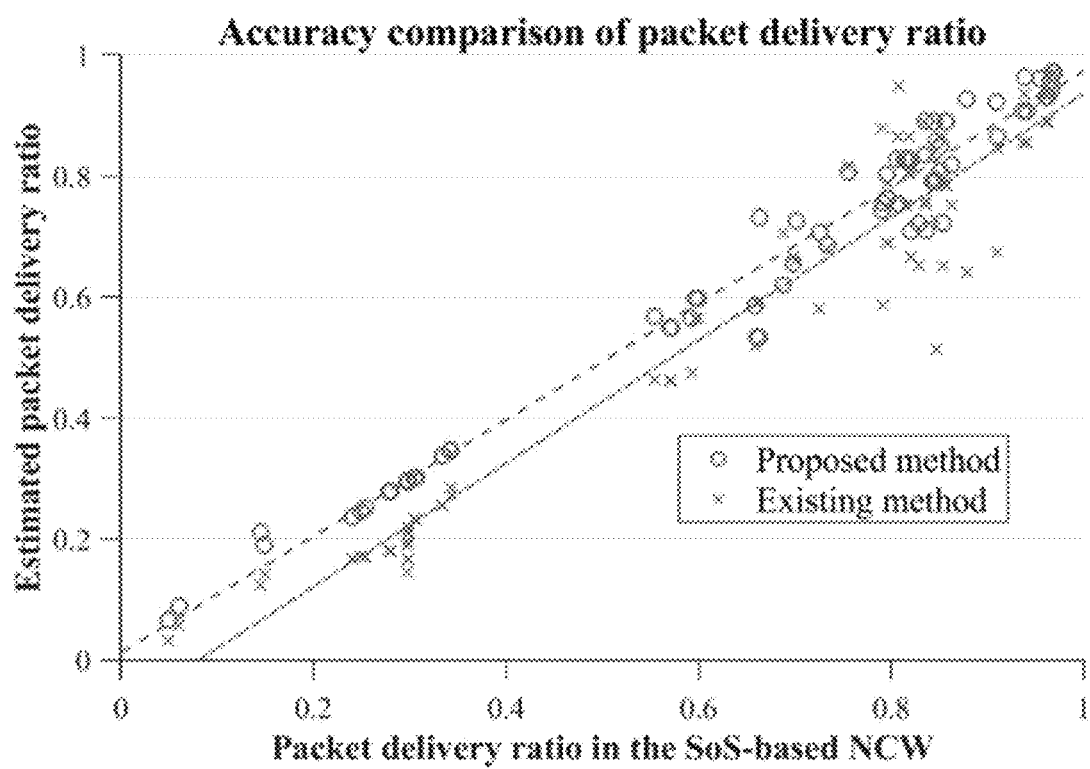
FIG. 10 is a graph for comparing packet delivery ratios (PDRs) of a system according to an exemplary embodiment of the present invention and a system in which influence of a C model is not taken into consideration.
Figure 11:
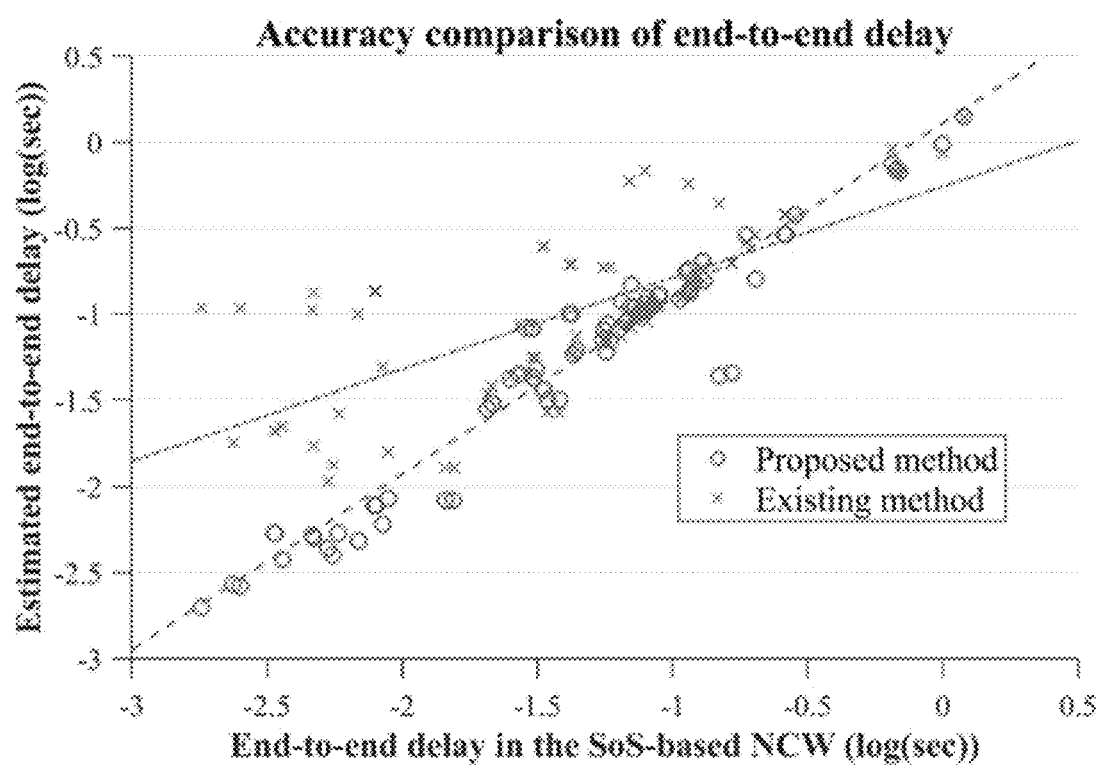
FIG. 11 is a graph for comparing end-to-end delays of a system according to an exemplary embodiment of the present invention and a system in which influence of a C model is not taken into consideration.

FIG. 10 is a graph for comparing PDRs of a system according to an exemplary embodiment of the present invention and a system in which influence of a C model is not taken into consideration, and FIG. 11 is a graph for comparing end-to-end delays of a system according to an exemplary embodiment of the present invention and a system in which influence of a C model is not taken into consideration.

In the graphs of FIGS. 10 and 11, x axes respectively denote a PDR and an end-to-end delay of an SoS, and y axes respectively denote a PDR and an end-to-end delay of a system according to an exemplary embodiment of the present invention. The "Proposed method" corresponds to a system according to an exemplary embodiment of the present invention, and the "Existing method" corresponds to a system in which influence of a C model is not taken into consideration.

In the graphs, it is possible to say that the more symmetrical the x axis and the y axis, the more accurate. As analysis result, in FIG. 10, root mean square errors (RMSEs) are measured to be 0.0425 and 0.997, which correspond to 4.6281% and 10.8407% (a maximum value and a minimum value are 0.0491 and 0.9691, respectively). In FIG. 11, RMSEs are measured to be 0.0520 and 0.1304, which correspond to 4.3721% and 10.9647% (a maximum value and a minimum value are 0.0018 and 1.1915, respectively).

Meanwhile, execution times of the existing SoS system and the system according to an exemplary embodiment of the present invention are compared in Table 1 below.

TABLE 1

|  | execution time (min.) | # of processed events in the network system |
|---|---|---|
| SoS | 60.539 | 2.539e+08 |
| Integrated system | 16.025 | 2.569e+08 |

Referring to Table 1 above, it is possible to see that the execution time of the integrated system according to an exemplary embodiment of the present invention is reduced to about ¼ of the execution time of the SoS system.

Also, it is possible to see that the PDR and the end-to-end delay of the integrated-system simulation system according to an exemplary embodiment of the present invention are similar to those of the SoS system. Therefore, the system according to an exemplary embodiment of the present invention makes it possible to not only simplify an existing SoS system (i.e., remarkably reducing the time required) but also bring about the same communication effects.

An integrated-system simulation system according to an exemplary embodiment of the present invention has the following effects.

The present invention allows efficient communication analysis with respect to an experimental scenario having various communication variables on the basis of a simulation execution time shortened through an abstraction process of a C2 system.

Effects that may be achieved by an integrated-system simulation system according to an exemplary embodiment of the present invention are not limited to those mentioned above, and other effects that have not been mentioned may be clearly understood by those of ordinary skill in the art to which the present invention pertains from the above description.

Although exemplary embodiments of the present invention have been described in detail above, those of ordinary skill in the art to which the present invention pertains will appreciate that various modifications may be made without departing from the scope of the present invention. Therefore, the scope of the present invention is to be determined by the following claims and their equivalents, and is not limited by the described exemplary embodiments.

What is claimed is:

1. An integrated-system simulation system obtained from a simulation system having a command, control, and communication (C3) system of systems (SoS), the integrated-system simulation system comprising a simulator configured to implement:
   (a) an abstracted command and control (C2) model including a traffic model including inter-node traffic information transferred according to time, a mobility model including position information of nodes, and an interface model configured to make the traffic model and the mobility model interoperate; and
   (b) a communication (C) model configured to be combined with the abstracted C2 model so as to interact with the abstracted C2 model in a full-duplex manner,
   wherein (c) the abstracted C2 model is generated by (c-1) acquiring traffic and mobility data between the C2 model and the C model of an SoS simulation system, (c-2) hypothesizing a form of the abstracted C2 model, and (c-3) learning the traffic and mobility data acquired from the SoS simulation system and determining variables of the abstracted C2 model form.

2. The integrated-system simulation system of claim 1, wherein the traffic model includes variables of a time interval IDT between packets, whether there is a connection C between the nodes, an initial time TST at which packet generation is started, and a time TET at which packet generation is finished.

3. The integrated-system simulation system of claim 2, wherein the traffic model performs a process comprising:
   generating traffic at time intervals of $T_{IDT}$ for a time of $T_{START}$ in an initial state;
   receiving communication effects from the interface model;
   learning the generated traffic and the communication effects received from the interface model with a machine learning-based neural network and determining the variables of the time interval IDT between packets, whether there is the connection C between the nodes, the initial time TST at which packet generation is started, and the time TET at which packet generation is finished; and
   when there is the connection C between the nodes, generating traffic at the intervals IDT after a time difference between TST and $T_{START}$ elapses, and stopping traffic generation at the time TET, and when there is not the connection C between the nodes, generating no traffic,
   wherein $T_{START}$ is a start time of the traffic model and $T_{IDT}$ is a time interval between pieces of traffic.

4. The integrated-system simulation system of claim 1, wherein the mobility model includes variables of a probability $P_{MOVE}$ of a node shifting to a moving state MOVE, a time $D_{MOVE}$ for which the node stays in the moving state MOVE, a time $D_{STOP}$ for which the node stays in a stop state STOP, and a moving speed SPD and an angle ANG of the node moving in the moving state MOVE.

5. The integrated-system simulation system of claim 4, wherein the mobility model performs a process comprising:
   calculating initial position information of the node;
   receiving communication effects from the interface model;
   determining the variables of $P_{MOVE}$, $D_{MOVE}$, $D_{STOP}$, SPD, and ANG based on the initial position information of the node and the communication effects received from the interface model by using a machine learning-based neural network; and
   updating the position information of the node through SPD and ANG for the time $D_{MOVE}$ when the node is in the moving state MOVE, and not updating the position information of the node for the time $D_{STOP}$ when the node is in the stop state STOP.

6. The integrated-system simulation system of claim 1, wherein the interface model calculates communication effects accumulated through events received from the C model and transfers the calculated communication effects to the traffic model and the mobility model.

7. The integrated-system simulation system of claim 6, wherein the interface model receives traffic information and position information generated by the traffic model and the mobility model and transfers the received traffic information and position information to the C model.

8. The integrated-system simulation system of claims 3, wherein the communication effects are a packet delivery ratio (PDR) indicating a probability of arrival of an inter-node packet and an end-to-end delay indicating a delay time taken for a packet to arrive.

9. The integrated-system simulation system of claims 5, wherein the communication effects are a packet delivery ratio (PDR) indicating a probability of arrival of an inter-node packet and an end-to-end delay indicating a delay time taken for a packet to arrive.

10. The integrated-system simulation system of claims 6, wherein the communication effects are a packet delivery ratio (PDR) indicating a probability of arrival of an inter-node packet and an end-to-end delay indicating a delay time taken for a packet to arrive.

* * * * *